(12) United States Patent
Jarboe, Jr. et al.

(10) Patent No.: US 7,155,637 B2
(45) Date of Patent: Dec. 26, 2006

(54) METHOD AND APPARATUS FOR TESTING EMBEDDED MEMORY ON DEVICES WITH MULTIPLE PROCESSOR CORES

(75) Inventors: James Michael Jarboe, Jr., Allen, TX (US); Nathan Weyer Wright, MissouriCity, TX (US); Nicholas Henry Schutt, Houston, TX (US); Van Ho, Stafford, TX (US)

(73) Assignee: Texas Instruments Incorporated, Dallas, TX (US)

( * ) Notice: Subject to any disclaimer, the term of this patent is extended or adjusted under 35 U.S.C. 154(b) by 592 days.

(21) Appl. No.: 10/425,410

(22) Filed: Apr. 29, 2003

(65) Prior Publication Data

US 2004/0153793 A1 Aug. 5, 2004

Related U.S. Application Data

(60) Provisional application No. 60/443,946, filed on Jan. 31, 2003.

(51) Int. Cl.
*G06F 11/00* (2006.01)
(52) U.S. Cl. .......................................... 714/8; 714/723
(58) Field of Classification Search ...................... 714/8
See application file for complete search history.

(56) References Cited

U.S. PATENT DOCUMENTS 4,191,996 A * 3/1980 Chesley ........................ 714/30

(Continued)

OTHER PUBLICATIONS

U.S. Appl. No. 10/136,818 entitled "Processor Based System and Method for Testing Embedded Memory" filed Apr. 30, 2002.

(Continued)

Primary Examiner—Gabriel L. Chu
(74) Attorney, Agent, or Firm—Jacqueline J. Garner; W. James Brady, III; Frederick J. Telecky, Jr.

(57) ABSTRACT

The disclosed method and apparatus enables the testing of multiple embedded memory arrays associated with multiple processor cores on a single computer chip. According to one aspect, the disclosed method and apparatus identifies certain rows and columns within each of the embedded memory arrays that need to be disabled and also identifies certain redundant rows and columns in the embedded memory array to be activated. According to another aspect, the disclosed method and apparatus generates a map indicating where each of the memory failures occurs in each embedded memory array. If the testing process determines that the embedded memory array cannot be repaired, then a signal is provided directly to an external testing device indicating that the embedded memory array is non-repairable. Similarly, if the testing process determines that the failures in the embedded memory array can be repaired, then a signal is provided directly to an external testing apparatus indicating that the embedded memory array is repairable. Lastly, if no failures are found in an embedded memory array, then a signal is provided to an external testing apparatus indicating that the embedded memory array contains no failures. Based upon these status signals, the external testing device can determine which set of data (i.e., repair data and/or failure map data) to off-load from each embedded memory array and which sets of data to disregard, thereby reducing the memory test time for a device. Another aspect of the disclosed method and apparatus is a data flow control unit that controls the flow of input and output data to each of the embedded memory arrays. This device broadcasts the test program to each of the embedded memory arrays at the same time thereby enabling the simultaneous testing of multiple embedded memory arrays. Yet another aspect of the disclosed method and apparatus is a shorthand notation for indicating where memory failures occur within an embedded memory array.

15 Claims, 5 Drawing Sheets

U.S. PATENT DOCUMENTS

| | | | |
|---|---|---|---|
| 5,123,016 A * | 6/1992 | Muller et al. | 714/711 |
| 5,748,640 A * | 5/1998 | Jiang et al. | 714/720 |
| 5,961,653 A * | 10/1999 | Kalter et al. | 714/7 |
| 5,991,898 A * | 11/1999 | Rajski et al. | 714/30 |
| 5,995,731 A | 11/1999 | Crouch et al. | 395/500.05 |
| 6,072,262 A | 6/2000 | Kim | 310/254 |
| 6,154,855 A * | 11/2000 | Norman | 714/10 |
| 6,170,070 B1 | 1/2001 | Ju et al. | 714/718 |
| 6,201,733 B1 * | 3/2001 | Hiraki et al. | 365/185.08 |
| 6,374,377 B1 | 4/2002 | Guddat et al. | 714/718 |
| 6,421,283 B1 * | 7/2002 | Walley et al. | 365/200 |
| 6,560,740 B1 | 5/2003 | Zuraski, Jr. et al. | 714/733 |
| 6,603,691 B1 * | 8/2003 | Yoo et al. | 365/201 |
| 6,907,548 B1 * | 6/2005 | Abdo | 714/43 |
| 2003/0037277 A1 * | 2/2003 | Tamura | 714/5 |
| 2003/0204782 A1 * | 10/2003 | Schutt et al. | 714/30 |
| 2003/0204783 A1 * | 10/2003 | Kuroda | 714/35 |

OTHER PUBLICATIONS

Nathan W. Wright; Central Processing Unit Built-In-Self-Test for Random Access Memory Test and Repair; A Thesis in Electrical Engineering; May 2002.

* cited by examiner

*FIG. 4A*

METHOD AND APPARATUS FOR TESTING EMBEDDED MEMORY ON DEVICES WITH MULTIPLE PROCESSOR CORES

CROSS REFERENCE TO RELATED APPLICATIONS

This patent application claims priority to provisional patent application No. 60/443,946 entitled "processor-Based Test Methodology for Embedded Memory on Devices with Multiple processor Cores," which has a filing date of Jan. 31, 2003 and is hereby incorporated by reference into the specification of this application.

BACKGROUND

The integrated circuit industry is under continuous pressure to reduce the size of the components on integrated circuits and to increase the number of devices that can be integrated onto a single chip. These market forces have been associated with what is known in the industry as Moore's Law. Moore's Law suggests that the number of transistors that can be fabricated on an integrated circuit doubles approximately every 18 to 20 months. Although Moore's Law is based upon purely empirical and historical data, it has been proven to be a reliable indicator of trends in the integrated circuit industry.

These market forces have led many in the industry to develop what is known as a System on a Chip ("SOC"). In a System on a Chip, multiple processors, memory circuits, registers, and other components are integrated onto a single computer chip so that one chip can perform the functions of an entire system. Digital Signal Processing ("DSP") chips commonly have multiple processors on a single chip to simultaneously perform a variety of math-intensive functions. As is known in the art, a memory cache often accompanies each processor on a chip. This memory cache enables the processor to operate at maximum efficiency by reducing the time required to retrieve data from memory locations outside of the chip. The memory cache associated with a processor is commonly an array of Static Random Access Memory ("SRAM") devices.

Because memory devices utilize very small features, one problem associated with the fabrication of these devices is that they are easily subject to damage from particles, lithographic misalignment, scratches, and other fabrication errors. To address these problems, memory arrays are often built with redundant rows and redundant columns that can be activated to replace rows or columns with defects. During the fabrication process, a memory array will generally be tested and the redundant rows and arrays will be activated before the device is packaged and shipped. If it is determined that the memory array cannot be repaired, then the device is scrapped before costly and time-consuming back-end processes (i.e. packaging) are performed.

A process for testing and repairing a memory array in a cache associated with a single computer processor is described in U.S. patent application Ser. No. 10/136,818 entitled "processor-Based System and Method for Testing Embedded Memory," which was filed on Apr. 30, 2002 and is hereby incorporated by reference into the specification of this application. To reduce the testing time for the memory associated with a processor core on a single computer chip, the process described in this application loads a computer program designed for execution on the processor on the chip. The program tests the memory cache and generates a repair solution for activating one or more of the redundant rows or columns in the memory array. After the repair solution is generated, it is offloaded from the computer chip so that a laser fusing or electrical fusing process can implement the repair solution. Although this process works well for a single core (i.e. processor) chip, its implementation on a multiple-core chip becomes much more complicated. As a result, there is a need in the art for a method and apparatus for testing memory arrays associated with multiple computer processors on a single chip.

BRIEF SUMMARY

Disclosed herein is a method and apparatus for testing embedded memory arrays in a computer chip having more than one processor core. According to principles known in the art, a built-in processor may be utilized to test an embedded memory array and generate a memory repair solution for that memory array. The disclosed method and apparatus enables multiple embedded memory arrays associated with multiple processor cores to be simultaneously tested on a single computer chip. According to one aspect, the disclosed method and apparatus identifies certain rows and columns within the embedded memory array that need to be disabled and also identifies certain redundant rows and columns in the embedded memory array to be activated. According to another aspect, the disclosed method and apparatus generates a map indicating where each of the memory failures occurs in an embedded memory array. If the testing process determines that the embedded memory array cannot be repaired, then a signal is provided to an external testing device indicating that the embedded memory array is non-repairable. Similarly, if the testing process determines that the failures in the embedded memory array can be repaired, then a signal is provided to an external testing apparatus indicating that the embedded memory array is repairable. Lastly, if no failures are found in an embedded memory array, then a signal is provided to an external testing apparatus indicating that the embedded memory array contains no failures. Based upon these status signals, the external testing device can determine which set of data (i.e., repair data and/or failure map data) to off-load from the embedded memory device and which sets of data to disregard, thereby reducing the memory test time for a device. Another aspect of the disclosed method and apparatus is a data flow control unit that controls the flow of input and output data to each of the embedded memory arrays. This device broadcasts the test program to each of the embedded memory arrays at the same time thereby enabling the simultaneous testing of multiple embedded memory arrays. Yet another aspect of the disclosed method and apparatus is a shorthand notation for indicating where memory failures occur within an embedded memory array. By utilizing this shorthand notation, the time required to off-load a map of the memory failures is greatly reduced. These features, as well as many other features and aspects, are described in further detail in the following detailed description.

DETAILED DESCRIPTION

Figure 1:
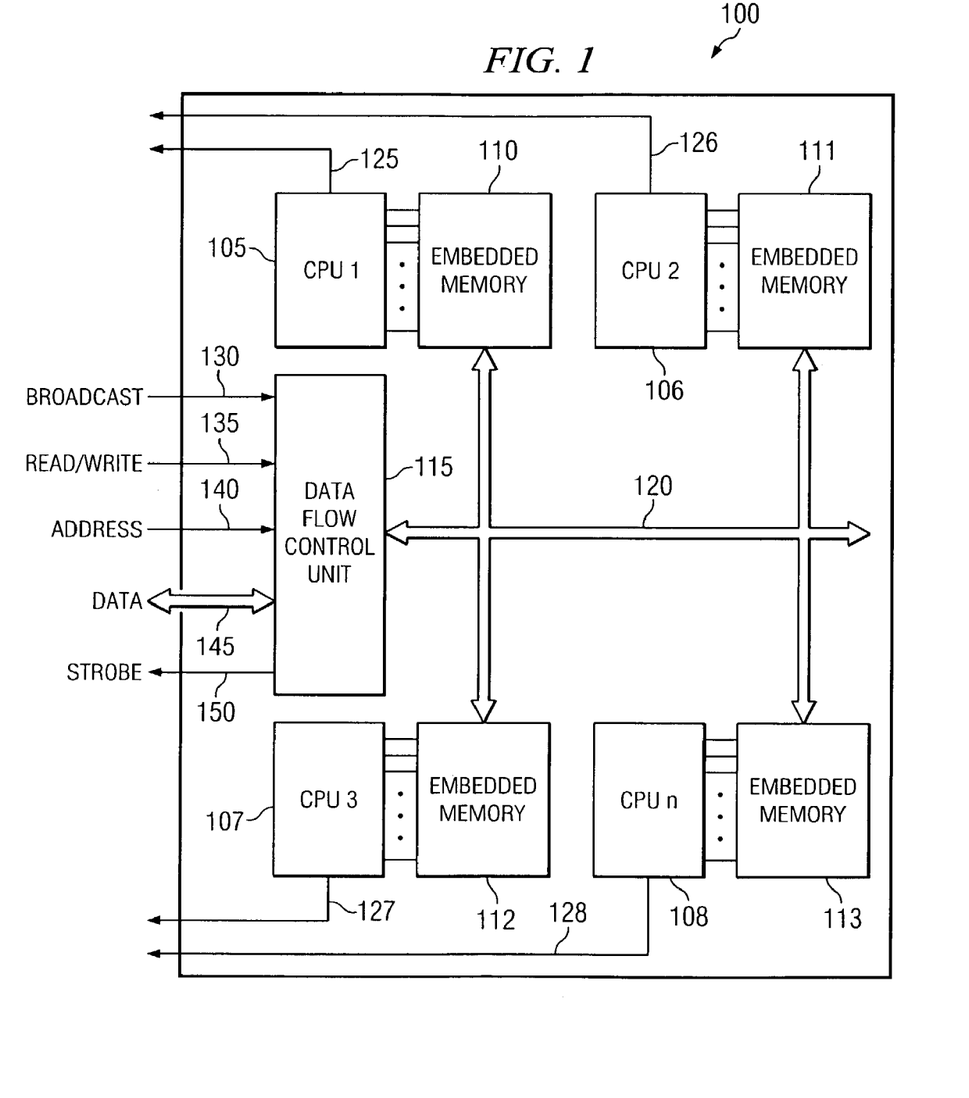
FIG. 1 is a block diagram representing a multiple-core computer chip suitable for use with one aspect of the disclosed method and apparatus.

A block diagram depicting a computer chip suitable for use with the disclosed method and apparatus is depicted in FIG. 1. In FIG. 1, the computer chip 100 is comprised of four separate processors 105, 106, 107, 108. Each of these processors is associated with an embedded memory cache 110, 111, 112, 113. Also depicted in FIG. 1 is a data flow control unit 115. The data flow control unit 115 receives information from an external tester and provides that information to each of the embedded memory caches 110, 111, 112, 113. To accomplish this, the data flow control unit 115 is connected to each of the embedded memory caches 110, 111, 112, 113 through a data bus 120. Also depicted in FIG. 1 are four processor status indicators 125, 126, 127, 128. According to one embodiment, each of these processor status indicators comprises a two-bit signal line that indicates the pass, fail, or repair status of an embedded memory cache associated with each corresponding processor. The processor status indicators 125, 126, 127, 128 are provided directly to bond pads that can be directly accessed by an external tester. A variety of signals may be provided to and received by the data flow control unit 115, including, for example, a broadcast signal line 130, a read/write signal line 135, an address line or address bus 140, a data bus 145, and a chip-originated strobe signal 150. Each of these signal lines can be used to control the input and output of data to the computer chip through the data flow control unit 115.

As described previously, it is desirable to utilize a processor associated with an embedded memory cache in order to perform testing of an associated memory cache. For a computer chip with multiple processor cores, such as the chip 100 depicted in FIG. 1, the presence of multiple processor cores on a single chip complicates the testing process. In particular, if each of the processor cores 105, 106, 107, 108 performs memory tests simultaneously, then the signaling of test results and repair solutions to an external testing apparatus could cause input/output errors and bus conflicts. To alleviate these problems, a data flow control unit 115 is built onto the computer chip 100 to control the input and output of data to the multiple processor cores 105, 106, 107, 108. According to one embodiment, the data flow control unit 115 comprises a host port interface (HPI) that is a slave-side peripheral that allows a host processor, such as an external testing device, to communicate with the multiple processor cores 105, 106, 107 and 108.

The process by which a test program is loaded into the processor chip is described generally below. First, an external tester is interfaced with the bond pads of the computer chip 100 so that the external tester can communicate directly with the data flow control unit 115. Next, the external tester provides a test program to the data flow control unit 115 through the data bus 145 along with appropriate read-write signals for the read-write signal line 135 and appropriate address information for the address line/bus 140. In addition, the external tester provides a broadcast signal to the broadcast line 130 so that information is simultaneously loaded directly into memory locations of each embedded memory cache 110, 111, 112, 113. This test program generally comprises an assembly language program designed for execution on a processor corresponding to an embedded memory cache. After the test program is loaded into the embedded memory caches 110, 111, 112, 113, the corresponding processors 105, 106, 107, 108 execute the test program to determine if there are any failures in the corresponding embedded memory cache. The results of this test program are provided directly to the external tester through the processor status indicators 125, 126, 127 and 128. As stated previously, the processor status indicators 125, 126, 127 and 128 may comprise a two-bit signal line indicating the pass, fail, or repair status of each of the embedded memory devices. According to one embodiment, the test program can also generate a repair solution for repairing a defective embedded memory cache. This repair solution will indicate which rows and columns of the embedded memory cache need to be deactivated and which redundant rows and columns of the embedded memory cache need to be activated. According to one embodiment, a repair solution can utilize the following format: block number; row repair (repairable row value, or some sentinel value like −1 if no row repair needed); column repair (column repair value, or some sentinel value like −1 if no column repair needed).

In addition to a repair solution, the test program may also generate a map of the location of the failures in the embedded memory cache. These two items of information will be stored in the embedded memory cache so that they can be offloaded to the tester at an appropriate time. After the testing of the embedded memory caches is complete, the external tester uses the processor status indicators 125, 126, 127, 128 to determine which memory caches have repair solutions that need to be offloaded. For example, if it is determined that processor 1 (105) contains too many failures to be repaired, then the external tester will not offload a repair solution and may not offload a map of the memory failures because this processor/embedded memory cache combination is non-repairable. On the other hand, the processor 2 (106) could indicate that it contained repairable failures in its associated memory cache. Accordingly, the external tester would offload the repair solution and the map of failing information for that processor/embedded memory cache. Lastly, processor 3 (107) could indicate that no memory failures were found and a repair solution and map of memory failure locations would not be needed. After determining which processors have repair or failure information that needs to be offloaded, the external tester would instruct the data flow control unit 115 to retrieve the appropriate set of data from one or more of the embedded memory caches 110, 111, 112, 113. By limiting the amount of information that is required to be offloaded from the chip 100, the testing time can be greatly reduced.

Figure 2:
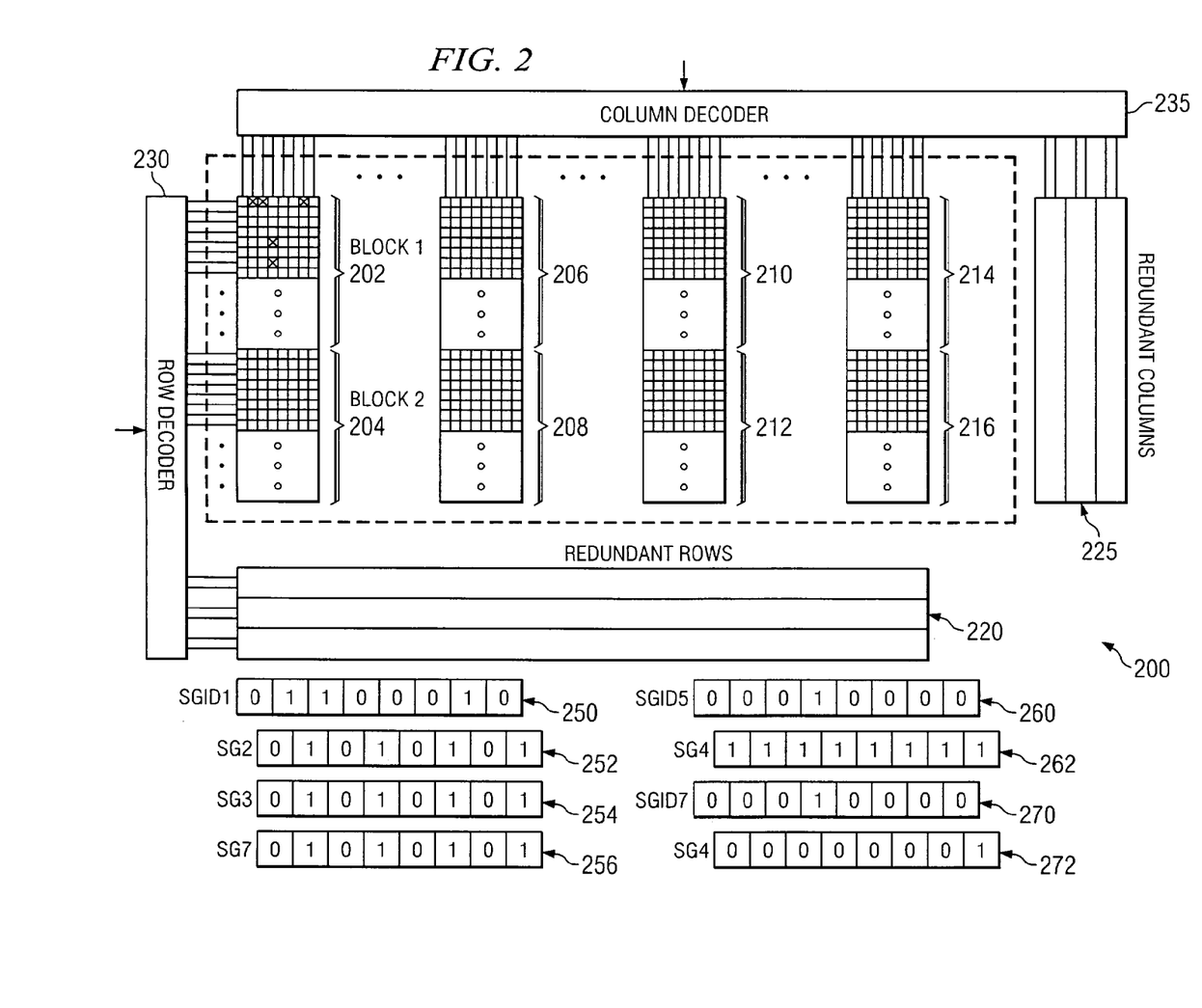
FIG. 2 is a block diagram representing a memory array and a shorthand notation for representing the location of memory failures within the memory array.

In order to further reduce the amount of information that must be offloaded from the computer chip 100 during the testing process, a shorthand notation can be used to indicate where the failures occur within a memory array. According to one embodiment, the shorthand notation corresponds to a bit-level map of the location of the various failures on the memory device. One example of a shorthand suitable for use with the disclosed method and apparatus is depicted in FIG. 2. In FIG. 2, a memory array 200 comprising a plurality of memory blocks 202, 204, 206, 208, 210, 212, 214 and 216 is depicted. Also depicted in FIG. 2 are a set of redundant rows 220 and a set of redundant columns 225. Each of the memory blocks 202–216 and the redundant rows 220 and redundant columns 225 are accessible by a row decoder 230 and a column decoder 235. Although the redundant rows 220 and redundant columns 225 are depicted as being placed outside of the main portion of the memory array in FIG. 2, other embodiments can be utilized with the disclosed method and apparatus. More specifically, the redundant rows 220 and redundant columns 225 can be placed adjacent to each of the memory blocks 202–216.

Within the first memory block 202, a grid depicting a plurality of rows and a plurality of words (i.e., groups of 16 bits of information) are illustrated. Also shown are 5 locations that contain Xs corresponding to words having memory failures. Specifically, the first row in memory block 1 (202) has three words that contain memory failures: Word 2, Word 3, and Word 7. In addition, the fourth word in the fifth row and the fourth word in the seventh row are marked with Xs that correspond to memory failures in those words. The shorthand notation for representing these memory failures is depicted in the lower half of FIG. 2.

The shorthand notation used to describe the memory failures depicted in block 1 (202) of the memory array 200 is depicted in the arrays 250–272. These arrays are comprised of three subgroup IDs 250, 260, 270, wherein each subgroup ID corresponds to a row in the memory block 202 that contains memory failures. Each bit in the subgroup ID corresponds to a word in the memory block 202. For example, in subgroup ID 1 (250), the second, third and seventh bits have been activated. These bits correspond to failures in the second, third and seventh words in the first row of the memory block 202. For each word in a subgroup ID that contains a failure, a subgroup is also provided describing all of the bits in that failing word. For example, subgroups 2, 3 and 7 (252, 254, and 256) describe each of the failing and passing bits contained in the second, third and seventh words from the subgroup ID 1 (250). Each of the subgroups 252, 254, 256, has failing bits at the second, fourth, sixth and eighth bits. Accordingly, by using this technique, the location of each failing bit in the memory array 200 can be recorded in a very efficient manner. Because this technique preserves the location of each failing bit within the memory array, this provides additional troubleshooting and diagnostics test so that failures in the memory array can be qualitatively evaluated. For example, the failure associated with the fourth word in the fifth row of memory block 1 (202) indicates that every bit in that word has failed (262). A failure pattern such as this could indicate a scratch or photolithographic misalignment that would affect all of the memory cells in a particular row. On the other hand, the failure pattern seen in subgroup 4 of subgroup ID 7 (270), indicates that only the eighth bit of this word has failed, therefore indicating an isolated error such as a particle.

Figure 3:
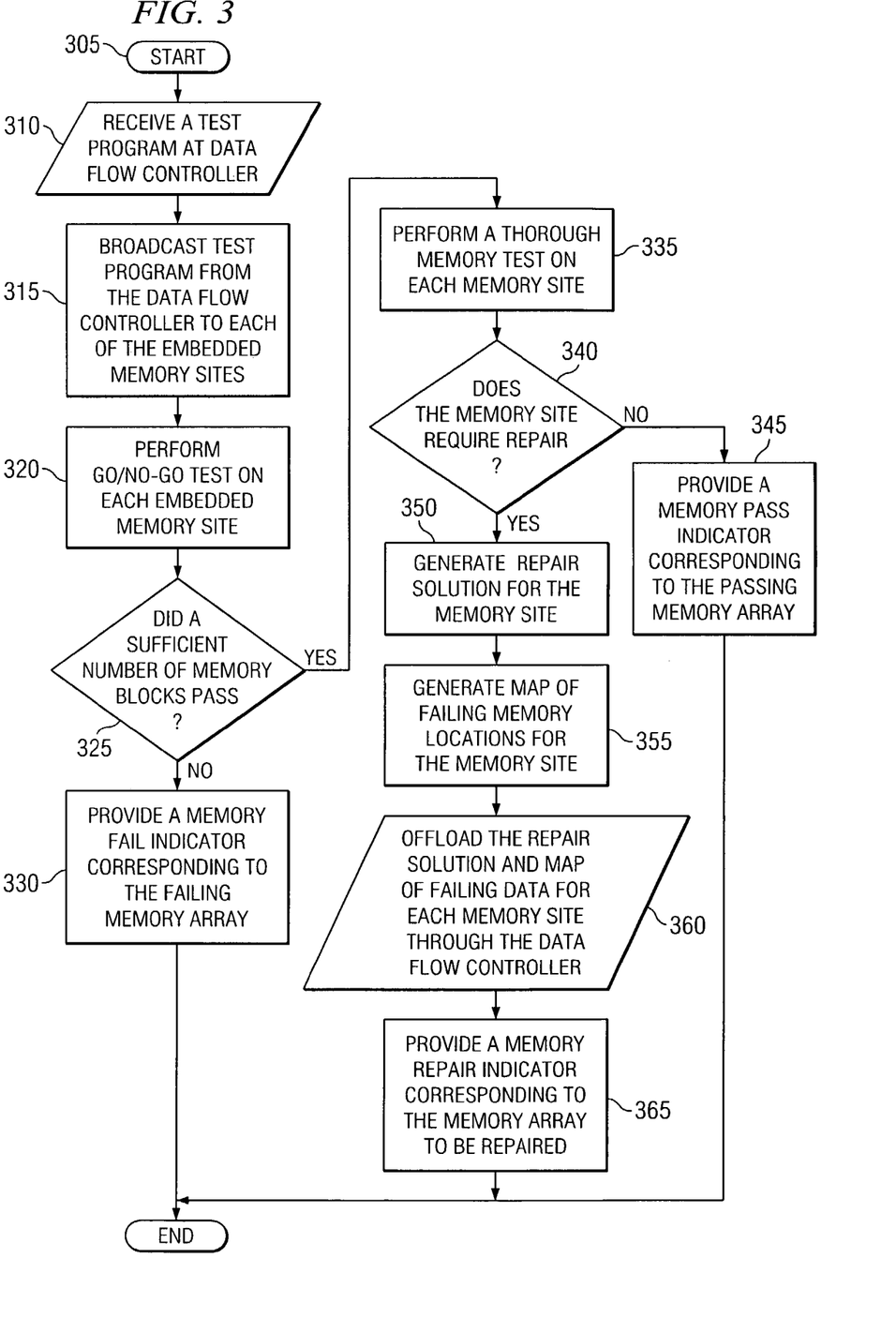
FIG. 3 is a process flow diagram depicting a representative process for testing embedded memory arrays associated with multiple processor cores.

A process by which the disclosed method and apparatus can be implemented is depicted in FIG. 3. The process starts (305) by receiving a test program at the data flow controller (310). After the data flow controller 115 receives the test program, it is broadcast from the data flow controller 115 to each of the embedded memory sites on the chip (315). After the test program has been loaded into the embedded memory sites, the program first performs a go/no-go test on each embedded memory site in order to determine which memory blocks in the memory array have failures and which memory blocks do not (320). The go/no-go test can be used to rapidly identify devices that have too many memory failures to be repaired. The process can also utilize timesaving algorithms for evaluating memory blocks. For example, if the first two memory blocks within a memory array both contain failures, then it is likely that there will not be sufficient redundant rows and columns to repair all of the remaining memory blocks. Accordingly, the entire memory array would then be listed as non-repairable. According to another embodiment, at least three error-free memory blocks in the memory array are required to perform the memory repair, failure mapping, and memory testing operations associated with the disclosed process invention. If three uncorrupted memory blocks are not available in the memory array, then the embedded memory site will be marked as non-repairable. If it is determined that a sufficient number of memory blocks could not pass the go/no-go test, the processor associated with that memory array will provide a memory fail indicator on the processor status indicator (330). If, however, a sufficient number of the memory blocks are found to be without errors (325) then testing of the memory array will continue. After it is determined that a sufficient number of memory blocks are available to execute the testing program, the test program then performs a thorough memory test on each embedded memory site (335). If, after testing the entire embedded memory site thoroughly, it is determined that the memory site does not require repair (340), then the associated processor will provide a memory pass indicator signal corresponding to the passing embedded memory array (345). On the other hand, if it is determined that the embedded memory site will require repair, then the testing program will generate a repair solution for the memory site (350). The repair solution for a particular embedded memory site will generally comprise instructions to deactivate certain rows or columns in the memory array and activate certain redundant rows or columns in the memory array. Accordingly, the repair solution will generally be a listing of those rows and columns to be deactivated or activated. After generating a repair solution, the program can also generate a map of the failing memory locations in the embedded memory array (355). According to one embodiment, this map will use a shorthand notation as described and illustrated in FIG. 2. After the repair solution and the map of failing of memory locations have been generated, this information is off-loaded from the memory array through the data flow controller (360). The processor will also provide a memory repair indicator corresponding to the memory array that is to be repaired (365). The memory repair indicator signal can be provided as soon as it is apparent that the memory site will require repair (340), or it can be provided after the repair solution and map of failing memory locations have been generated.

Figure 4:
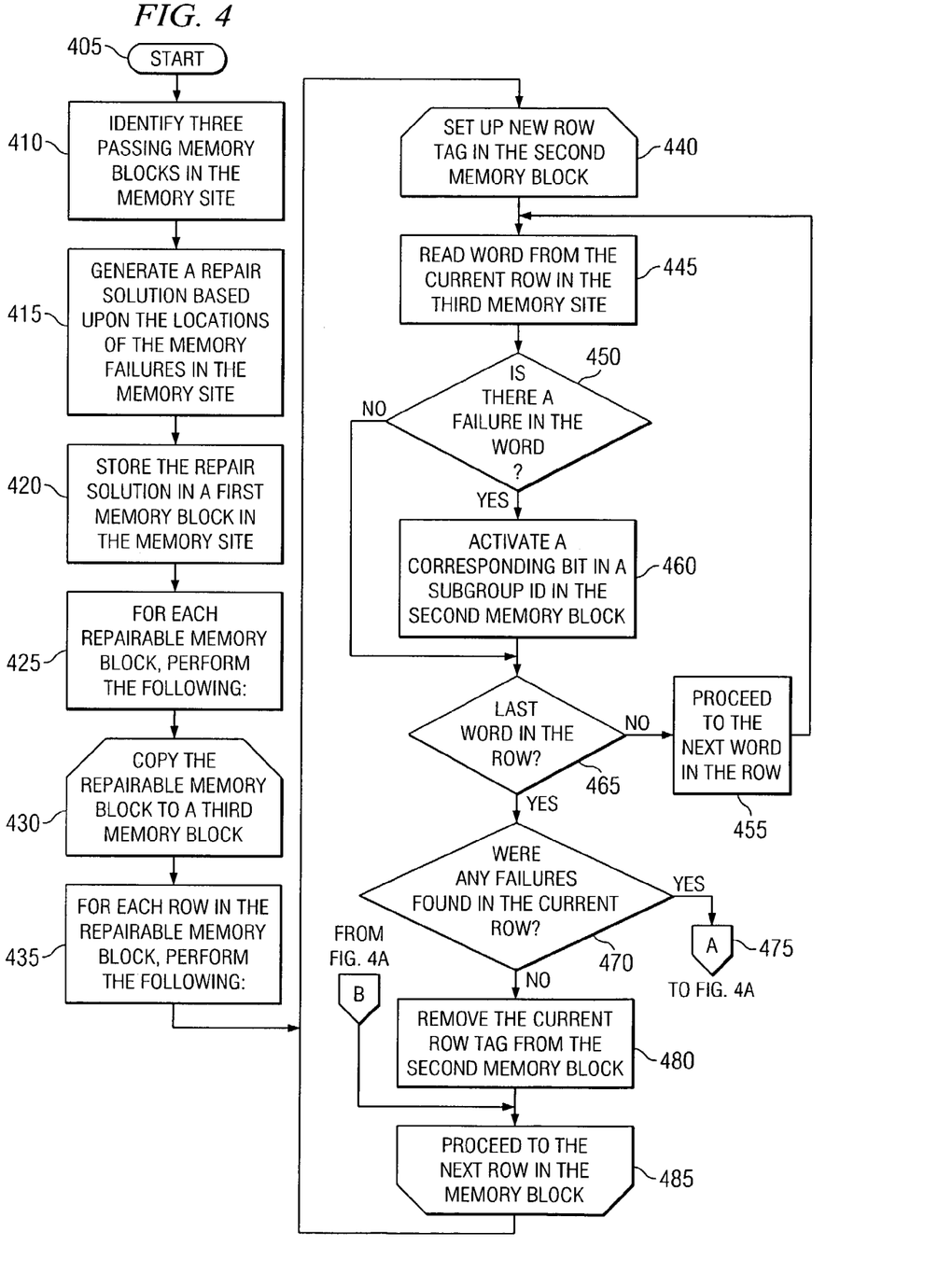
FIG. 4 is a process flow diagram depicting a representative process by which a map of memory failures within an embedded memory array can be generated.

The process by which the repair solution and map of failing memory locations can be generated is depicted in FIG. 4. The process starts (405) by first identifying three memory blocks in the embedded memory site that contain no failures (410). After this, the program generates a repair solution based upon the locations of the memory failures in the rest of the memory site (415). This repair solution is then stored in the first memory block that was identified as having no failures (420). In order to generate a shorthand notation of the location of the failing memory sites within the memory array, the program performs the following steps for each repairable memory block (425). First, the repairable memory block is copied into the third memory block that was identified as having no memory failures (430). This "image" of the repairable memory block is then used to generate the shorthand notation for the location of the specific memory failures. For each row in the repairable memory block, the following steps are performed (435). First, a new row tag is initialized in the second memory block that was identified as having no memory failures (440). Next, a word is read from the current row in the third memory site (a.k.a. the "image") (445). If there is not a failure within the word (450) then the process proceeds to the next word in the row (455). If, however, a failure is detected in the word, a bit in a subgroup ID corresponding to the location of the memory failure in the second memory block will be activated (460). After this, the process proceeds to the next word in the row (455). When the process reaches the last word in the row (465), the process determines if any failures were found in the row that was just processed (470). If failures were found in the current row, then the process proceeds to the operations depicted in FIG. 4A (475). If failures were not found in the current row, then the current row tag is removed from the second memory block (480) and the process proceeds to the next row in the memory block 485.

Figure 4A:
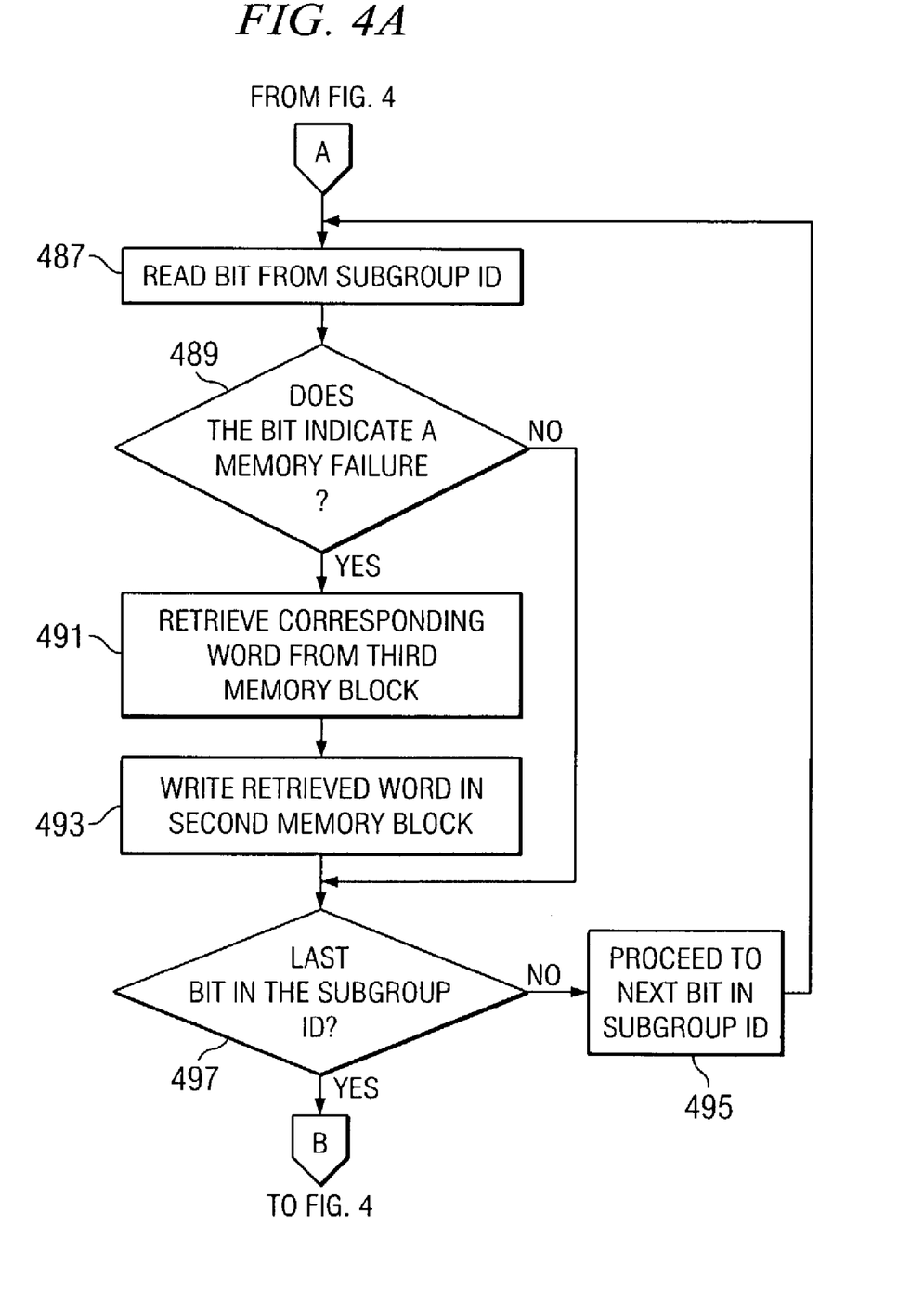
FIG. 4A is a process flow diagram depicting one aspect of a representative process by which a map of memory failures within an embedded memory array can be generated.

If failures were found in the row, then the process will utilize the steps depicted in FIG. 4A. The process begins by reading a bit from the subgroup ID (487). If the bit indicates a memory failure (489), then a corresponding word from the third memory block (i.e. the "image") will be retrieved (491). After this, the retrieved word is written into the second memory block (493). If, however, the bit does not indicate a memory failure (489) then these steps (491, 493) are bypassed. After this, the process proceeds to the next bit in the subgroup ID (495). Upon reaching the last bit in the subgroup ID (497) the process returns to step 485 depicted in FIG. 4.

We claim:

1. A method for testing a plurality of embedded memory sites resident on a computer chip, wherein each of the embedded memory sites is associated with a computer processor of a plurality of computer processors also resident on the computer chip, the method comprising:
    receiving a test program at a data flow controller resident on the computer chip;
    broadcasting the test program to each of the plurality of embedded memory sites on the computer chip;
    executing the test program at each of computer processors, wherein the test program determines a pass, fail, or repair status of a memory site, and generates a repair solution for each of the memory sites whose status is repair;
    providing a memory status indicator corresponding to each of the memory sites wherein the memory status indicator indicates a pass, fail, or repair status of the memory sites;
    for each of the memory sites indicating a repair status, retrieving a first block of memory corresponding to the repair solution for the memory sites; and
    providing each of the retrieved first blocks of memory corresponding to each of the repair solutions to a testing device.

2. A method according to claim 1, wherein executing the test program further comprises generating a map of the failing memory locations for each of the memory sites indicating a fail or repair status, the method further comprising:
    for each of the memory sites indicating a repair or fail status, retrieving a second block of memory corresponding to the map of failing memory locations; and
    providing each of the retrieved second blocks of memory corresponding to each of the maps of failing memory locations to an external device for testing.

3. A method according to claim 2, wherein the process of executing the test program comprises:

executing a first portion of the test program at each of the computer processors, wherein the first portion of the test program performs a go/no-go test on each of the memory blocks in a corresponding embedded memory site;
if at least three memory blocks are found to pass the go/no-go test at an embedded memory site, then performing the following at a corresponding memory site:
    executing a second portion of the test program at a corresponding computer processor, wherein the second portion of the test program determines a pass, fail, or repair status of a corresponding memory site;
    if the memory site indicates a repair status, then executing a third portion of the test program at a corresponding computer processor, wherein the third portion of the test program generates a repair solution for the corresponding embedded memory site and stores the repair solution in a first block of passing memory; and
    if the memory site indicates a repair or fail status, then executing a fourth portion of the test program at a corresponding computer processor, wherein the fourth portion of the test program utilizes the third block of passing memory to generate a map of the failing memory locations and stores the map in the second block of passing memory.

4. A method according to claim 3, wherein the go/no-go test comprises:
    if the first two memory blocks in a corresponding embedded memory site contain failures, then indicating a fail status for the corresponding embedded memory site.

5. A method according to claim 1, further comprising:
    for each of the memory sites indicating a repair status, implementing a corresponding repair solution by activating certain redundant memory cells and deactivating defective memory cells.

6. A method according to claim 5, wherein activating and deactivating memory cells utilizes a fusing process.

7. A method for testing a plurality of embedded memory sites on a computer chip, wherein each of the embedded memory sites is associated with a corresponding computer processor of a plurality of computer processors on the computer chip, the method comprising:
    receiving a test program at a data flow controller resident on the computer chip;
    broadcasting the test program from the data flow controller to each of the plurality of embedded memory sites on the computer chip;
    executing a first portion of the test program at each of the computer processors, wherein the first portion of the test program identifies a first, second and third block of memory in a corresponding embedded memory site that do not have any memory failures;
    executing a second portion of the test program at each of the computer processors, wherein the second portion of the test program determines a pass, fail, or repair status of a corresponding memory site;
    providing a memory status indicator corresponding to each of the memory sites wherein the memory status indicator indicates a pass, fail, or repair status of the memory sites;
    for each of the memory sites indicating a repair status, executing a third portion of the test program at each of the computer processors that generates a repair solution for each repairable memory location in the corresponding memory site and stores the repair solution in the first block of memory;

for each of the memory sites indicating a repair or fail status, executing a fourth portion of the test program at each of the computer processors wherein the fourth portion of the test program utilizes the third block of memory to generate a map of the failing memory locations and stores the map in the second block of passing memory, for each of the memory sites indicating a repair status, retrieving the repair solution for the memory sites from the first block of memory and retrieving the map of the failing memory locations from the corresponding second block of memory; and providing each of the repair solutions and the maps of the failing memory locations to a testing device for processing.

8. A method according to claim 7, further comprising:

for each of the memory sites indicating a fail status, retrieving the map of the failing memory locations from the corresponding second block of memory.

9. A method according to claim 8, further comprising:

for each of the memory sites indicating a repair status, implementing a corresponding repair solution by activating certain redundant memory cells and deactivating defective memory cells.

10. A method according to claim 7, wherein generating a map of the failing memory locations comprises:

copying a repairable memory block to the third block of memory;

for each row of memory in the third block of memory, performing the following:

initializing a new row tag in the second block of memory;

for each of the words in the current row of memory, performing the following:

if there is a memory failure in the current word, the activating a corresponding bit in a subgroup ID in the second memory block;

proceed to the next word in the rows if there were any memory failures found in the current row, then performing the following:

for each bit indicating a memory failure in the current subgroup ID, retrieving a corresponding word from the third memory block and writing the retrieved word in the second memory block;

if there are not any memory failures found in the current row, then removing the current row tag from the second memory block; and proceed to processing the next row in the memory block.

11. A method according to claim 10, wherein activating and deactivating memory cells utilizes a fusing process.

12. An integrated circuit operable to simultaneously perform self-testing of a plurality of embedded memory sites, the integrated circuit comprising:

a plurality of embedded processors operable to simultaneously execute a memory testing program;

a plurality of embedded memory sites, each of which corresponds to one of the embedded processors;

a data flow control unit connected to each of the embedded memory sites and operable to receive a memory testing program from an external testing device and provide the memory testing program to each of the embedded memory sites;

a plurality of processor status indicators, each of which corresponds to one of the embedded memory sites, wherein each of the processor status indicators is operable to provide a pass, fail or repair status of a corresponding embedded memory site based upon the results of executing a portion of the memory testing program wherein the data flow controller is operable to retrieve a repair solution generated by the memory testing program from each of the embedded memory sites indicating a repair status and provide the repair solution to the external testing device.

13. An integrated circuit according to claim 12, wherein the data flow controller is further operable to retrieve a map of failing memory locations generated by the memory testing program from each of the embedded memory sites indicating a repair or fail status and provide the map of failing memory locations to the external testing device.

14. An integrated circuit according to claim 12 wherein the data flow control unit further comprises a host port interface that allows the external testing device to communicate with each of the embedded processors.

15. An integrated circuit according to claim 12 wherein the data flow control unit further comprises strobe generator and a strobe output for synchronizing the transfer of data from an embedded memory site to an external testing device.

* * * * *